(12) United States Patent
Yamane et al.

(10) Patent No.: US 8,637,947 B2
(45) Date of Patent: Jan. 28, 2014

(54) MEMORY ELEMENT AND MEMORY APPARATUS

(71) Applicant: Sony Corporation, Tokyo (JP)

(72) Inventors: Kazutaka Yamane, Kanagawa (JP); Masanori Hosomi, Tokyo (JP); Hiroyuki Ohmori, Kanagawa (JP); Kazuhiro Bessho, Kanagawa (JP); Yutaka Higo, Kanagawa (JP); Tetsuya Asayama, Tokyo (JP); Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/684,644

(22) Filed: Nov. 26, 2012

(65) Prior Publication Data

US 2013/0140658 A1    Jun. 6, 2013

(30) Foreign Application Priority Data

Dec. 1, 2011    (JP) ................. 2011-263289

(51) Int. Cl.
*H01L 29/82* (2006.01)
*G11C 11/02* (2006.01)

(52) U.S. Cl.
USPC ........... 257/421; 257/422; 257/423; 257/425; 257/426; 257/427; 438/3; 365/157; 365/158; 360/324; 360/324.2

(58) Field of Classification Search
USPC ........ 257/20, 414, 421–427, E29.323; 438/3; 365/157–158; 360/324–326
See application file for complete search history.

(56) References Cited

U.S. PATENT DOCUMENTS 6,256,223 B1    7/2001 Sun
2004/0036361 A1*   2/2004 Dai et al. .................. 307/64

FOREIGN PATENT DOCUMENTS

JP    2003-017782 A    1/2003
JP    2008-227388 A    9/2008

OTHER PUBLICATIONS

Berger, "Emission of spin waves by a magnetic multilayer traversed by a current," Physical Review B, Oct. 1, 1996, pp. 9353-9358, vol. 54, No. 13.
Slonczewski, "Current-driven excitation of magnetic multilayers," Journal of Magnetism and Magnetic Materials, Jan. 1996, pp. L1-L7.
Mangin et al., "Current-induced magnetization reversal in nanopillars with perpendicular anisotrophy," Nature Materials, Feb. 19, 2006, , pp. 210-215, vol. 5, Nature Publishing Group.
Parkin, Systematic Variation of the Strength and Oscillation Period of Indirect Magnetic Exchange Coupling through the 3d, 4d and 5d Transition Metals. Physical Review Letters. Dec. 16, 1991;67(25):3598-3601.

* cited by examiner

*Primary Examiner* — Jami M Valentine
(74) *Attorney, Agent, or Firm* — Wolf, Greenfield & Sacks, P.C.

(57) ABSTRACT

A memory element includes a layered structure and a negative thermal expansion material layer. The layered structure includes a memory layer, a magnetization-fixed layer, and an intermediate layer. The memory layer has magnetization perpendicular to a film face in which a magnetization direction is changed depending on information, and includes a magnetic layer having a positive magnetostriction constant. The magnetization direction is changed by applying a current in a lamination direction of the layered structure to record the information in the memory layer. The magnetization-fixed layer has magnetization perpendicular to a film face that becomes a base of the information stored in the memory layer. The intermediate layer is formed of a non-magnetic material and is provided between the memory layer and the magnetization-fixed layer.

13 Claims, 9 Drawing Sheets

FIG.7A Sample 1 (Comparative)
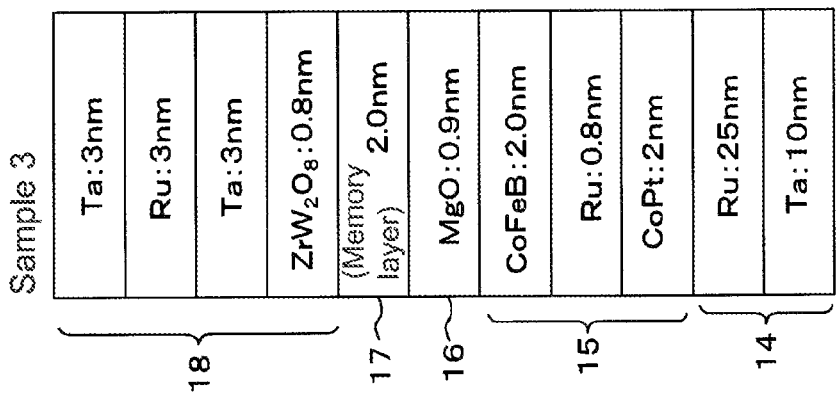
FIG.7B Sample 2
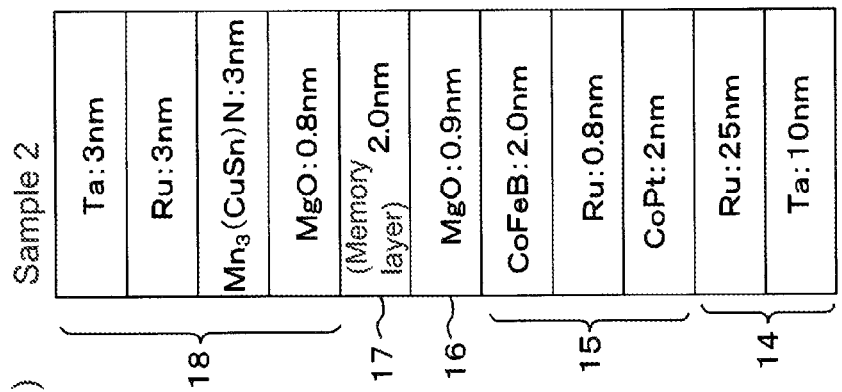
FIG.7C Sample 3
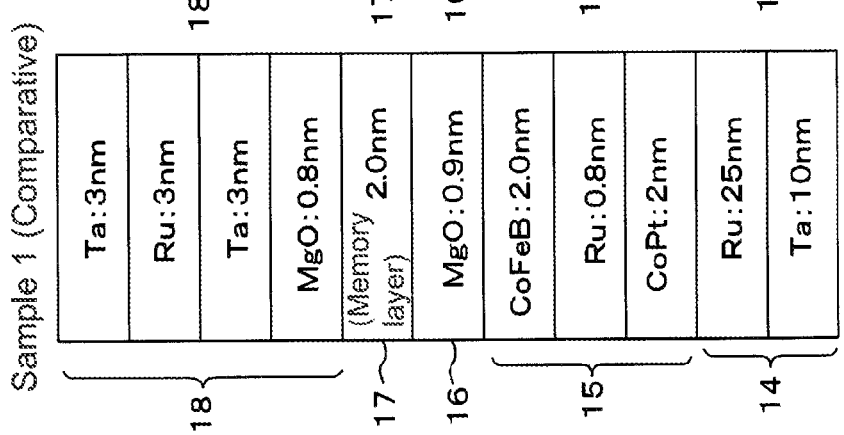
FIG.7D Memory layer 17

MEMORY ELEMENT AND MEMORY APPARATUS

CROSS REFERENCE TO RELATED APPLICATIONS

This application claims priority to Japanese Priority Patent Application JP 2011-263289, filed in the Japan Patent Office on Dec. 1, 2011, the entire content of which is hereby incorporated by reference.

BACKGROUND

The present disclosure relates to a memory element and a memory apparatus that have a plurality of magnetic layers and make a record using a spin torque magnetization switching.

Along with a rapid development of various information apparatuses from mobile terminals to large capacity servers, further high performance improvements such as higher integration, increases in speed, and lower power consumption have been pursued in elements such as a memory element and a logic element configuring the apparatuses. In particular, a semiconductor non-volatile memory has significantly progressed, and, as a large capacity file memory, a flash memory is spreading at such a rate that hard disk drives are replaced with the flash memory. Meanwhile, the development of FeRAM (Ferroelectric Random Access Memory), MRAM (Magnetic Random Access Memory), PCRAM (Phase-Change Random Access Memory), or the like has progressed as a substitute for the current NOR flash memory, DRAM or the like in general use, in order to use them for code storage or as a working memory. A part of these is already in practical use.

Among them, the MRAM performs the data storage using the magnetization direction of a magnetic material so that high speed and nearly unlimited ($10^{15}$ times or more) rewriting can be made, and therefore has already been used in fields such as industrial automation and an airplane. The MRAM is expected to be used for code storage or a working memory in the near future due to high-speed operation and reliability. However, the MRAM has challenges related to lowering power consumption and increasing capacity. This is a basic problem caused by the recording principle of the MRAM, that is, the method of switching the magnetization using a current magnetic field generated from an interconnection.

As a method of solving this problem, a recording method not using the current magnetic field, that is, a magnetization switching method, is under review. In particular, research on a spin torque magnetization switching has been actively made (for example, see Japanese Unexamined Patent Application Publication Nos. 2003-17782 and 2008-227388, U.S. Pat. No. 6,256,223, Physical Review B, 54, 9353 (1996), Journal of Magnetism and Magnetic Materials, 159, L1 (1996), Nature Materials., 5, 210 (2006)).

The memory element using a spin torque magnetization switching is often includes an MTJ (Magnetic Tunnel Junction) similarly as the MRAM.

This configuration uses a phenomenon in which, when spin-polarized electrons passing through a magnetic layer which is fixed in an arbitrary direction enter another free (the direction is not fixed) magnetic layer, a torque (which is also called as a spin transfer torque) is applied to the magnetic layer, and the free magnetic layer is switched when a current having a predetermined threshold value or more flows. The rewriting of 0/1 is performed by changing the polarity of the current.

An absolute value of a current for the switching is 1 mA or less in the case of a memory element with a scale of approximately 0.1 μm. In addition, since this current value decreases in proportion to a volume of the element, scaling is possible. In addition, since a word line necessary for the generation of a recording current magnetic field in the MRAM is not necessary, there is an advantage that a cell structure becomes simple.

Hereinafter, the MRAM utilizing a spin torque magnetization switching will be referred to as a Spin Torque-Magnetic Random Access Memory (ST-MRAM). The spin torque magnetization switching is also referred to as a spin injection magnetization switching. Great expectations are put on the ST-MRAM as a non-volatile memory capable of realizing lower power-consumption and larger capacity while maintaining the advantages of the MRAM in which high speed and nearly unlimited rewriting may be performed.

SUMMARY

In the MRAM, writing interconnections (word lines and bit lines) are disposed separately from the memory element, and information is written (recorded) by a current magnetic field generated by applying a current to the writing interconnections. Thus, the current necessary for writing can sufficiently flow into the writing interconnections.

On the other hand, in the ST-MRAM, it is necessary that the current flowing to the memory element induces the spin torque magnetization switching to switch the magnetization direction of the memory layer.

The information is written (recorded) by applying a current directly to the memory element in this manner. In order to select a memory cell to which writing is made, the memory element is connected to a selection transistor to configure the memory cell. In this case, the current flowing to the memory element is limited by the amount of the current that can flow to the selection transistor, i.e., by the saturation current of the selection transistor.

Thus, it is necessary to perform writing with a current equal to or less than the saturation current of the selection transistor, and it is known that the saturation current of the transistor decreases along with miniaturization. In order to miniaturize the ST-MRAM, it is necessary that spin transfer efficiency be improved and the current flowing to the memory element be decreased.

In addition, it is necessary to secure a high large magnetoresistance change ratio to amplify a read-out signal.

In order to realize this, it is effective to adopt the above-described MTJ structure, that is, to configure the memory element in such a manner that an intermediate layer that comes into contact with the memory layer is used as a tunnel insulating layer (tunnel barrier layer).

In the case where the tunnel insulating layer is used as the intermediate layer, the amount of the current flowing to the memory element is restricted to prevent the insulation breakdown of the tunnel insulating layer from occurring. That is, the current necessary for the spin torque magnetization switching has to be restricted from the viewpoint of securing reliability with respect to repetitive writing of the memory element.

The current necessary for the spin torque magnetization switching is also called as a switching current, a memory current or the like.

Also, since the ST-MRAM is a non-volatile memory, it is necessary to stably store the information written by a current.

That is, it is necessary to secure stability (thermal stability) with respect to thermal fluctuations in the magnetization of the memory layer.

In the case where the thermal stability of the memory layer is not secured, a switched magnetization direction may be re-switched due to heat (temperature in an operational environment), and which results in a writing error.

The memory element in the ST-MRAM is advantageous in scaling compared to the MRAM in the related art, that is, advantageous in that the volume of the memory layer can be small, as described above in terms of a recording current value. However, as the volume is small, the thermal stability may be deteriorated as long as other characteristics are the same.

As the capacity increase of the ST-MRAM proceeds, the volume of the memory element becomes smaller, such that it is important to secure the thermal stability.

Therefore, in the memory element of the ST-MRAM, the thermal stability is a significantly important characteristic, and it is necessary to design the memory element in such a manner that the thermal stability thereof is secured even when the volume is decreased.

In other words, in order to provide the ST-MRAM as the non-volatile memory, the switching current necessary for the spin torque magnetization switching is decreased not to exceed the saturation current of a transistor or not to break the tunnel barrier. Also, it is necessary to secure the thermal stability for holding the written information. However, by nature of the magnetic material, there is a problem that the thermal stability undesirably decreases inherently as the ambient temperature increases.

It is desirable to provide a memory element as an ST-MRAM that secures a thermal stability not depending on the ambient temperature.

According to the embodiment of the present disclosure, there is provided a memory element, including a layered structure including
a memory layer having magnetization perpendicular to a film face in which a magnetization direction is changed corresponding to information,
a magnetization-fixed layer having magnetization perpendicular to a film face that becomes a base of the information stored in the memory layer, and
an intermediate layer that is formed of a non-magnetic material and is provided between the memory layer and the magnetization-fixed layer. The magnetization direction of the memory layer is changed by applying a current in a lamination direction of the layered structure to record the information in the memory layer. In addition, the memory layer includes a magnetic layer having a positive magnetostriction constant. In addition to the layered structure, a negative thermal expansion material layer is disposed.

A memory apparatus according to the embodiment of the present disclosure includes a memory element holding information depending on a magnetization state of a magnetic material, and two types of interconnections intersected each other. The memory element is the one having the configuration as described above, and is disposed between the two types of the interconnections. Through the two types of the interconnections, a current in a lamination direction flows to the memory element.

The memory element according to the embodiment of the present disclosure includes the memory layer holding the information depending on the magnetization state of the magnetic material, and the magnetization-fixed layer formed on the memory layer via the intermediate layer. The information is recorded by switching the magnetization of the memory layer utilizing the spin torque magnetization switching induced by the current flowing in the lamination direction. Therefore, when the current is applied in the lamination direction, the information can be recorded. Since the memory layer is a perpendicular magnetization film, a written current value necessary for switching the magnetization direction of the memory layer can be decreased.

At the same time, the thermal stability can be sufficiently provided even in the memory layer with a small volume due to strong magnetic anisotropic energy of the perpendicular magnetization film. In addition, the thermal stability can be kept high at a temperature above the room temperature.

The thermal stability decreases as the ambient temperature increases by nature of the magnetic material. Therefore, a negative thermal expansion material layer that shrinks as the temperature increases is provided in the embodiment.

When the perpendicular magnetization magnetic material is pulled in a plane direction, the coercive force thereof increases. As the temperature increases, the coercive force and the thermal stability of the memory layer decrease. On the other hand, the negative thermal expansion material layer shrinks to pull the memory layer, thereby increasing the coercive force. Thus, the coercive force less decreases, and it can maintain the thermal stability so as not to significantly decrease.

In addition, according to the memory apparatus of an embodiment of the present disclosure, a current flows through the two types of interconnections to the memory element in the lamination direction to induce a spin transfer. Thus, information can be recorded by the spin torque magnetization switching when a current flows through the two types of interconnections to the memory element in the lamination direction.

Also, the thermal stability of the memory layer can be sufficiently kept not depending on the ambient temperature, whereby the information recorded in the memory element can be stably held, the memory apparatus can be miniaturized, reliability can be enhanced, and power consumption can be decreased.

According to an embodiment of the present disclosure, there is provided the memory element having high perpendicular magnetic anisotropy at a temperature above the room temperature. Therefore, since the thermal stability, which is an information holding capacity, can be sufficiently secured, it is possible to configure the memory element having well-balanced properties in a wide temperature range.

Thus, operation errors can be eliminated, and operation margins of the memory element can be fully provided. Accordingly, it is possible to realize a memory that stably operates with high reliability.

It is also possible to decrease a writing current and to decrease power consumption when writing into the memory element.

As a result, it is possible to decrease power consumption of the entire memory apparatus.

These and other objects, features and advantages of the present disclosure will become more apparent in light of the following detailed description of best mode embodiments thereof, as illustrated in the accompanying drawings.

BRIEF DESCRIPTION OF DRAWINGS

FIGS. 7A to 7D each are an explanatory view of a layered structure of an experimental sample;

DETAILED DESCRIPTION OF EMBODIMENTS

The embodiment of the present disclosure will be described in the following order.
<1. Configuration of Memory apparatus according to Embodiment>
<2. General Description of Memory Element according to Embodiment>
<3. Specific Configuration of Embodiment>
<4. Experiment>
<5. Alternative>
<1. Configuration of Memory Apparatus According to Embodiment>

Firstly, a configuration of a memory apparatus according to an embodiment of the present disclosure will be described.

Figure 1:
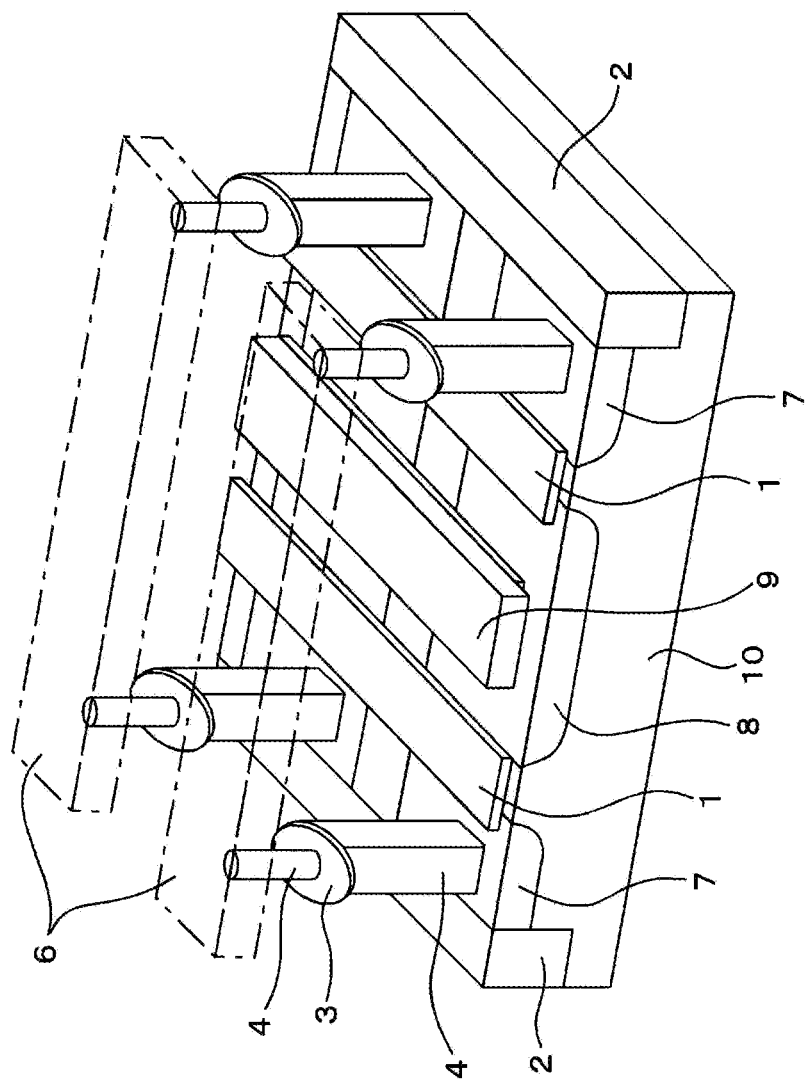
FIG. 1 an explanatory view of a memory apparatus according to an embodiment of the present disclosure.
Figure 2:
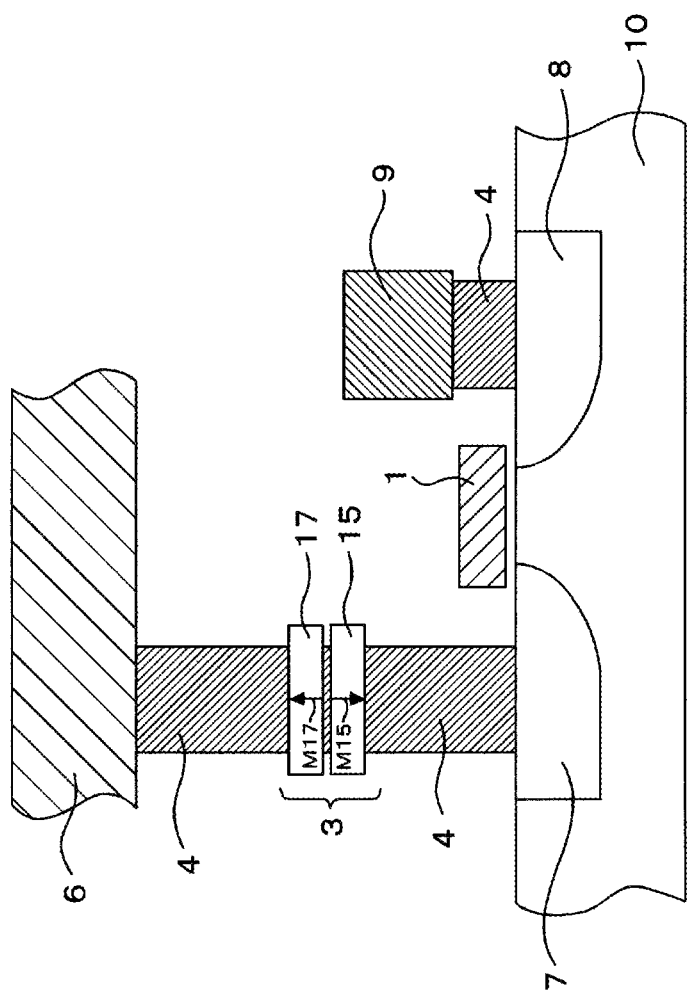
FIG. 2 is a cross-sectional view of a memory apparatus according to the embodiment.

FIGS. 1 and 2 each show a schematic diagram of the memory apparatus according to the embodiment. FIG. 1 is a perspective view and FIG. 2 is a cross-sectional view.

As shown in FIG. 1, in the memory apparatus according to the embodiment, a memory element 3 including an ST-MRAM that can hold information depending on a magnetization state is disposed in the vicinity of an intersection of two kinds of address interconnections (for example, a word line and a bit line) that are perpendicular with each other.

In other words, a drain region 8, a source region 7, and a gate electrode 1 that make up a selection transistor for the selection of each memory apparatus are formed in a semiconductor substrate 10, such as a silicon substrate, at portions isolated by an element isolation layer 2. Among them, the gate electrode 1 functions also as an address interconnection (a word line) extending in the front-back direction in FIG. 1.

The drain region 8 is formed commonly with right and left selection transistors in FIG. 1, and an interconnection 9 is connected to the drain region 8.

The memory element 3 having a memory layer that switch a magnetization direction by a spin torque magnetization switching is disposed between the source region 7 and a bit line 6 that is disposed at an upper side and extends in the right-left direction in FIG. 1. The memory element 3 is configured with, for example, a magnetic tunnel junction element (MTJ element).

As shown in FIG. 2, the memory element 3 has two magnetic layers 15 and 17. In the two magnetic layers 15 and 17, one magnetic layer is set as a magnetization-fixed layer 15 in which the direction of magnetization M15 is fixed, and the other magnetic layer is set as a magnetization-free layer in which the direction of magnetization M17 varies, that is, a memory layer 17.

In addition, the memory element 3 is connected to each bit line 6 and the source region 7 through upper and lower contact layers 4, respectively.

In this manner, when a current in the vertical direction is applied to the memory element 3 through the two types of address interconnections 1 and 6, the direction of the magnetization M17 of the memory layer 17 can be switched by a spin torque magnetization switching.

In such a memory apparatus, it is necessary to perform writing with a current equal to or less than the saturation current of the selection transistor, and it is known that the saturation current of the transistor decreases along with miniaturization. In order to miniaturize the memory apparatus, it is desirable that spin transfer efficiency be improved and the current flowing to the memory element 3 be decreased.

In addition, it is necessary to secure a high magnetoresistance change ratio to amplify a read-out signal, in order to realize this, it is effective to adopt the above-described MTJ structure, that is, to configure the memory element 3 in such a manner that an intermediate layer is used as a tunnel insulating layer (tunnel barrier layer) between the two magnetic layers 15 and 17.

In the case where the tunnel insulating layer is used as the intermediate layer, the amount of the current flowing to the memory element 3 is restricted to prevent the insulation breakdown of the tunnel insulating layer from occurring. That is, it is desirable to restrict the current necessary for the spin torque magnetization switching from the viewpoint of securing reliability with respect to repetitive writing of the memory element 3. The current necessary for the spin torque magnetization switching is also called as a switching current, a memory current or the like.

Also, since the memory apparatus is a non-volatile memory apparatus, it is necessary to stably store the information written by a current. That is, it is necessary to secure stability (thermal stability) with respect to thermal fluctuations in the magnetization of the memory layer.

In the case where the thermal stability of the memory layer is not secured, a switched magnetization direction may be re-switched due to heat (temperature in an operational environment), which results in a writing error.

The memory element 3 (ST-MRAM) in the memory apparatus is advantageous in scaling compared to the MRAM in the related art, that is, advantageous in that the volume of the memory layer can be small. However, as the volume is small, the thermal stability may be deteriorated as long as other characteristics are the same.

As the capacity increase of the ST-MRAM proceeds, the volume of the memory element 3 becomes smaller, such that it is important to secure the thermal stability.

Therefore, in the memory element 3 of the ST-MRAM, the thermal stability is a significantly important characteristic, and it is necessary to design the memory element in such a manner that the thermal stability thereof is secured even when the volume is decreased.

<2. General Description of Memory Element According to Embodiment>

Then, a general description of the memory element 3 according to the embodiment will be described.

The memory element 3 according to the embodiment records information by switching the magnetization direction of the memory layer by the above-mentioned spin torque magnetization switching.

The memory layer is composed of a magnetic material including a ferromagnetic layer, and holds the information depending on the magnetization state (magnetic direction) of the magnetic material.

Figure 3:
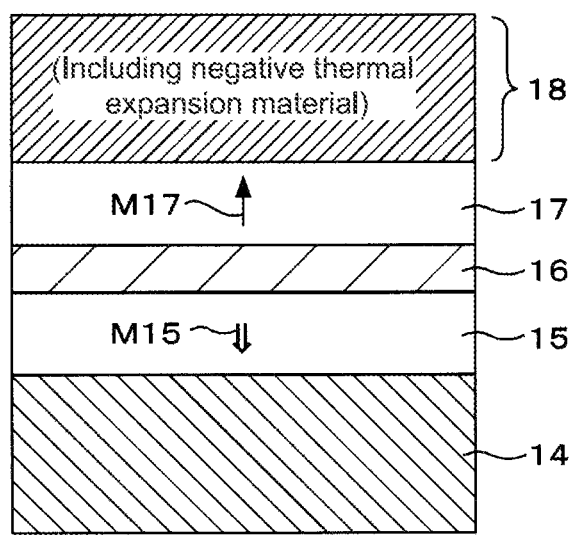
FIG. 3 is an explanatory view of memory elements according to the embodiment.

The memory element 3 has a layered structure, for example, as shown in FIG. 3, and includes the memory layer 17 and the magnetization-fixed layer 15 as the at least two ferromagnetic layers, and an intermediate layer 16 disposed between the two magnetic layers.

The memory layer 17 has magnetization perpendicular to a film face, in which a magnetization direction is changed corresponding to the information.

The magnetization-fixed layer 15 has magnetization perpendicular to a film face that becomes a base of the information stored in the memory layer 17.

The intermediate layer 16 is formed of a non-magnetic material and is provided between the memory layer 17 and the magnetization-fixed layer 15.

By injecting spin polarized ions in a lamination direction of the layered structure having the memory layer 17, the intermediate layer 16 and the magnetization-fixed layer 15, the magnetization direction of the memory layer 17 is changed, whereby the information is stored in the memory layer 17.

Here, the spin torque magnetization switching will be briefly described.

For electrons there are two values for spin angular momentums. The states of the spin are defined temporarily as an up and down. The numbers of up spin and down spin electrons are the same in the non-magnetic material. But the numbers of up spin and down spin electrons differ in the ferromagnetic material. In two ferromagnetic layers, i.e., the magnetization-fixed layer 15 and the memory layer 17, of the ST-MRAM, the case that the directions of the magnetic moment of each layer are in a reverse direction and the electrons are moved from the magnetization-fixed layer 15 to the memory layer 17 will be considered.

The magnetization-fixed layer 15 is a fixed magnetic layer having the direction of the magnetic moment fixed by high coercive force.

The electrons passed through the magnetization-fixed layer 15 are spin polarized, that is, the numbers of up spin and down spin electrons differs. When the thickness of the intermediate layer 16 that is the non-magnetic layer is made to be sufficiently thin, the electrons reach the other magnetic material, that is, the memory layer 17 before the spin polarization is mitigated by passing through the magnetization-fixed layer 15 and the electrons become a common non-polarized state (the numbers of up spin and down spin electrons are the same) in a non-polarized material.

A sign of the spin polarization in the memory layer 17 is reversed so that a part of the electrons is switched for lowering the system energy, that is, the direction of the spin angular momentum is changed. At this time, the entire angular momentum of the system is necessary to be conserved so that a reaction equal to the total angular momentum change by the electron, the direction of which is changed, is applied also to the magnetic moment of the memory layer 17.

In the case where the current, that is, the number of electrons passed through per unit time is small, the total number of electrons, the directions of which, are changed, becomes small so that the change in the angular momentum occurring in the magnetic moment of the memory layer 17 becomes small, but when the current is increased, it is possible to apply large change in the angular momentum within a unit time.

The time change of the angular momentum is a torque, and when the torque exceeds a threshold value, the magnetic moment of the memory layer 17 starts a precession, and rotates 180 degrees due to its uniaxial anisotropy to be stable. That is, the switching from the reverse direction to the same direction occurs.

When the magnetization directions are in the same direction and the electrons are made to reversely flow from the memory layer 17 to the magnetization-fixed layer 15, the electrons are then reflected at the magnetization-fixed layer 15. When the electrons that are reflected and spin-switched enter the memory layer 17, a torque is applied and the magnetic moment is switched to the reverse direction. However, at this time, the amount of current necessary for causing the switching is larger than that in the case of switching from the reverse direction to the same direction.

The switching of the magnetic moment from the same direction to the reverse direction is difficult to intuitively understand, but it may be considered that the magnetization-fixed layer 15 is fixed such that the magnetic moment is not switched, and the memory layer 17 is switched for conserving the angular momentum of the entire system. Thus, the recording of 0/1 is performed by applying a current having a predetermined threshold value or more, which corresponds to each polarity, from the magnetization-fixed layer 15 to the memory layer 17 or in a reverse direction thereof.

Reading of information is performed by using a magnetoresistive effect similarly to the MRAM in the related art. That is, as is the case with the above-described recording, a current is applied in a direction perpendicular to the film face. Then, a phenomenon in which an electrical resistance shown by the element varies depending on whether or not the magnetic moment of the memory layer 17 is the same or reverse direction to the magnetic moment of the magnetization-fixed layer 15 is used.

A material used for the intermediate layer 16 between the magnetization-fixed layer 15 and the memory layer 17 may be a metallic material or an insulating material, but the insulating material may be used for the intermediate layer to obtain a relatively high read-out signal (resistance change ratio), and to realize the recording by a relatively low current. The element at this time is called a ferromagnetic tunnel junction (Magnetic Tunnel Junction: MTJ) element.

A threshold value Ic of the current necessary to reverse the magnetization direction of the magnetic layer by the spin torque magnetization switching is different depending on whether an easy axis of magnetization of the magnetic layer is an in-plane direction or a perpendicular direction.

Although the memory element according to the embodiment has perpendicular magnetization, in a memory having an in-plane magnetization in the related art, the switching current for switching the magnetization direction of the magnetic layer is represented by Ic_para. When the direction is switched from the same direction to the reverse direction, the equation holds, $$Ic\_para = (A \cdot \alpha \cdot Ms \cdot V/g(0)/P)(Hk + 2\pi Ms).$$

When the direction is switched from the reverse direction to the same direction, the equation holds, $$Ic\_para = -(A \cdot \alpha \cdot Ms \cdot V/g(\pi)/P)(Hk + 2\pi Ms).$$

The same direction and the reverse direction denote the magnetization directions of the memory layer based on the magnetization direction of the magnetization-fixed layer, and are also referred to as a parallel direction and a non-parallel direction, respectively.

On the other hand, in the perpendicular memory element having perpendicular magnetization according to the embodiment, the switching current is represented by Ic_perp. When the direction is switched from the same direction to the reverse direction, the equation holds, $$Ic\_perp = (A \cdot \alpha \cdot Ms \cdot V/g(0)/P)(Hk - 4\pi Ms)$$

When the direction is switched from the reverse direction to the same direction, the equation holds, $$Ic\_perp = -(A \cdot \alpha \cdot Ms \cdot V/g(\pi)/P)(Hk - 4\pi Ms)$$

where A represents a constant, α represents a damping constant, Ms represents a saturation magnetization, V represents an element volume, P represents a spin polarizability, g(0) and g(π) represent coefficients corresponding to efficiencies of the spin torque transmitted to the other magnetic layer in the same direction and the reverse direction, respectively, and Hk represents the magnetic anisotropy.

In the respective equations, when the term (Hk−4πMs) in the perpendicular magnetization type is compared with the term (Hk+2πMs) in the in-plane magnetization type, it can be understood that the perpendicular magnetization type is suitable to decrease a recording current.

Here, a relationship between a switching current Ic0 and a thermal stability index Δ is represented by the following [Equation 1].

$$I_C 0 = \left(\frac{4ek_B T}{\hbar}\right)\left(\frac{\alpha \Delta}{\eta}\right)$$

where e represents an electron charge, η represents spin injection efficiency, h with bar represents a reduced Planck constant, α represents a damping constant, $k_B$ represents Boltzmann constant, and T represents a temperature.

According to the embodiment, the memory element includes the magnetic layer (memory layer 17) capable of holding the information depending on the magnetization state, and the magnetization-fixed layer 15 in which the magnetization direction is fixed.

The memory element has to hold the written information to function as a memory. An index of ability to hold the information is the thermal stability index Δ (=KV/$k_B$T). The Δ is represented by the (Equation 2).

$$\Delta = \frac{KV}{k_B T} = \frac{M_S V H_K}{2k_B T}$$

where Hk represents an effective anisotropic magnetic field, $k_B$ represents Boltzmann constant, T represents a temperature, Ms represents a saturated magnetization amount, V represents a volume of the memory layer, and K represents the anisotropic energy.

The effective anisotropic magnetic field Hk is affected by a shape magnetic anisotropy, an induced magnetic anisotropy, a crystal magnetic anisotropy and the like. Assuming a single-domain coherent rotation model, the Hk will be equal to coercive force.

The thermal stability index Δ and the threshold value Ic of the current have often the trade-off relationship. Accordingly, in order to maintain the memory characteristics, the trade-off often becomes an issue.

In practice, in a circle TMR element having, for example, the memory layer 17 with a thickness of 2 nm and a plane pattern with a diameter of 100 nm, the threshold value of the current to change the magnetization state of the memory layer is about a hundred to hundreds μA.

In contrast, in the MRAM in the related art for switching the magnetization using a current magnetic field, the written current exceeds several mA.

Accordingly, in the ST-MRAM, the threshold value of the written current becomes sufficiently low, as described above. It can be effective to decrease the power consumption of the integrated circuit.

In addition, since the interconnections for generating the current magnetic field generally used in the MRAM in the related art are unnecessary, the ST-MRAM is advantageous over the MRAM in the related art in terms of the integration.

When the spin torque magnetization switching is induced, a current applied directly into the memory element to write (record) the information. In order to select a memory cell to which writing is made, the memory element is connected to a selection transistor to configure the memory cell.

In this case, the current flowing to the memory element is limited by the amount of the current that can flow to the selection transistor, i.e., by the saturation current of the selection transistor.

In order to decrease the recording current, the perpendicular magnetization type is desirably used, as described above. Also, the perpendicular magnetization type can generally provide higher magnetic anisotropy than the in-plane magnetization type, and therefore is desirable in that the Δ is kept greater.

Examples of the magnetic material having the perpendicular anisotropy include rare earth—transition metal alloys (such as TbCoFe), metal multilayer films (such as a Co/Pd multilayer film), ordered alloys (such as FePt), those utilizing interfacial magnetic anisotropy between an oxide and a magnetic metal (such as Co/MgO) and the like. When the rare earth—transition metal alloys are diffused and crystallized by being heated, the perpendicular magnetic anisotropy is lost, and therefore the rare earth—transition metal alloys are not desirable as an ST-MRAM material.

It is known that also the metal multilayer film is also diffused when being heated, and the perpendicular magnetic anisotropy is degraded. Since the perpendicular magnetic anisotropy is developed, when the metal multilayer film has a face-centered cubic (111) orientation, it may be difficult to realize a (001) orientation necessary for a high polarizability layer including MgO, and Fe, CoFe and CoFeB disposed adjacent to MgO. L10 ordered alloy is stable even at high temperature and shows the perpendicular magnetic anisotropy in the (001) orientation. Therefore, the above-mentioned problem is not induced. However, the L10 ordered alloy has to be heated at sufficiently high temperature of 500° C. or more during the production, or atoms have to be arrayed regularly by being heated at a high temperature of 500° C. or more after the production. It may induce undesirable diffusion or an increase in interfacial roughness in other portions of a laminated film such as a tunnel barrier.

In contrast, the material utilizing interfacial magnetic anisotropy, i.e., the material including MgO as the tunnel barrier and a Co or Fe material laminated thereon hardly induces any of the above-mentioned problems, and is therefore highly expected as the memory layer material of the ST-MRAM.

As shown above (Equation 2), the thermal stability index KV/$k_B$T is expressed by the effective anisotropic magnetic field Hk. In general, when the same memory layer is used, the effective anisotropic magnetic field Hk and the coercive force Hc have a corresponding relationship, so that an increase in the corrective force Hc means an increase in the effective anisotropic magnetic field Hk.

In general, the coercive force Hc_MTJ of the memory layer decreases as the ambient temperature increases.

As the ambient temperature increases, the thermal stability index $KV/k_BT$ may be undesirably lower than that obtained at room temperature.

Accordingly, as the ambient temperature increases, it is difficult to stably operate the ST-MRAM.

In order to solve this problem, the present inventors have discovered a memory element, including:

a layered structure including a memory layer that has magnetization perpendicular to a film face in which a magnetization direction is changed depending on information, and includes a magnetic layer having a positive magnetostriction constant, the magnetization direction being changed by applying a current in a lamination direction of the layered structure to record the information in the memory layer, a magnetization-fixed layer having magnetization perpendicular to a film face that becomes a base of the information stored in the memory layer, and an intermediate layer that is formed of a non-magnetic material and is provided between the memory layer and the magnetization-fixed layer; and a negative thermal expansion material layer.

Herein, the negative thermal expansion material is a material whose volume decreases as the temperature increases. In contrast, a material whose volume increases as the temperature increases is a positive thermal expansion material.

When a distortion is added by an external stress or the like, the coercive force Hc of the memory layer 17 used in the ST-MRAM is represented by the following (Equation 3):

$$Hc = Hc\_MTJ + \frac{3\sigma\lambda}{Ms}$$

where Hc_MTJ represents an inherent coercive force Hc of the memory layer, λ represents a magnetostriction constant of the material in the memory layer, α represents an stress (a positive value represents a tensile stress, and a negative value represents a compressive stress) in the memory layer along the easy axis of magnetization (the direction perpendicular to the film face of the memory layer), and A represents a constant.

The first right side term in the above Equation 3 is a characteristic value of the material in the memory layer 17, and is determined by the material in the MTJ. The second right side term in the above Equation 3 is a value attributed to an internal stress of the memory layer, and can be changed by the distortion of the surrounding material in the MTJ.

Generally speaking, when the ambient temperature increases, a substance expands (positive thermal expansion). In contrast, a special material system shrinks in a certain temperature range above the room temperature (negative thermal expansion).

In other words, depending on the signs of the magnetoresistive constant, when the memory layer 17 has a positive magnetoresistive constant, the negative thermal expansion material to which a tensile stress is applied is disposed on the material adjacent to the layer that is contacted with the memory layer 17 at an opposite side from the tunnel barrier. In this way, the decrease in the thermal stability due to the increase in the ambient temperature can be inhibited.

According to the embodiment, the memory layer 17 is based on Co—Fe—B having the positive magnetoresistive constant. As shown in FIG. 3, the layer of the negative thermal expansion material is involved in the cap layer 18.

Although the perpendicular magnetic anisotropy arising from the interfacial magnetic anisotropy is said to be induced by binding oxygen contained in the oxide and Co or Fe at the interface, there is a problem that the anisotropic energy itself is small and is lowered as the magnetic layer thickens, as compared with the crystal magnetic anisotropy shown by the ordered alloy, a single ion anisotropy shown by rare earths, and the like.

In order to solve this problem, the present inventors have found that an oxide is disposed on both sides of the magnetic metal, the number of the interfaces between the oxide and the magnetic metal is increased, thereby improving the perpendicular magnetic anisotropy of the memory layer 17.

For example, by adopting the layered structure including at least one laminated structure having a substrate/the underlying layer 14/the magnetization-fixed layer 15/the intermediate layer 16 (the tunnel barrier layer formed of an oxide)/the memory layer 17/a cap layer in which at least the interface is formed of an oxide, the anisotropy of the memory layer 17 can be enhanced.

In other words, by adopting the layered structure including at least one laminated structure in which the oxide layer, the Co—Fe—B magnetic layer and the non-magnetic layer (non-magnetic additive material) are laminated, the anisotropy of the memory layer 17 can be improved.

In view of the saturated current value of the selection transistor, as the non-magnetic intermediate layer 16 between the memory layer 17 and the magnetization-fixed layer 15, the magnetic tunnel junction (MTJ) element is configured using the tunnel insulating layer including an insulating material.

The magnetic tunnel junction (MTJ) element is configured by using the tunnel insulating layer, such that it is possible to make a magnetoresistance change ratio (MR ratio) high compared to a case where a giant magnetoresistive effect (GMR) element is configured by using a non-magnetic conductive layer, and therefore it is possible to increase read-out signal strength.

In particular, when magnesium oxide (MgO) is used as the material of the intermediate layer 16 as the tunnel insulating layer, it is possible to make the magnetoresistance change ratio (MR ratio) high.

In addition, generally, the spin transfer efficiency depends on the MR ratio, and as the MR ratio is high, the spin transfer efficiency is improved, and therefore it is possible to decrease the magnetization switching current density.

Therefore, when magnesium oxide is used as the material of the tunnel insulating layer and the memory layer 17 is used, it is possible to decrease the writing threshold current by the spin torque magnetization switching and therefore it is possible to perform the writing (recording) of information with a small current. In addition, it is possible to increase the read-out signal strength.

In this manner, it is possible to decrease the writing threshold current by the spin torque magnetization switching by securing the MR ratio (TMR ratio), and it is possible to perform the writing (recording) of information with a small current. In addition, it is possible to increase the read-out signal strength.

As described above, in the case where the tunnel insulating layer is formed of the magnesium oxide (MgO) film, it is desirable that the MgO film be crystallized and a crystal orientation be maintained in the (001) direction.

In this embodiment, in addition to a configuration formed of the magnesium oxide, the intermediate layer 16 (tunnel insulating layer) disposed between the memory layer 17 and the magnetization-fixed layer 15 may be configured by using, for example, various insulating materials, dielectric materials, and semiconductors such as aluminum oxide, aluminum nitride, $SiO_2$, $Bi_2O_2$, $MgF_2$, CaF, $SrTiO_2$, $AlLaO_2$, and Al—N—O.

An area resistance value of the tunnel insulating layer has to be controlled to several tens $\Omega\mu m^2$ or less from the viewpoint of obtaining a current density necessary for switching the magnetization direction of the memory layer 17 by the spin torque magnetization switching.

In the tunnel insulating layer including the MgO film, the film thickness of the MgO film is necessary to set to 1.5 nm or less in order to provide the are resistance value within the above-mentioned range.

Adjacent to the memory layer 17, a cap layer 18, which has the oxide layer, is disposed.

As the oxide of the cap layer 18, MgO, aluminum oxide, $TiO_2$, $SiO_2$, $Bi_2O_2$, $SrTiO_2$, $AlLaO_2$, and Al—N—O are used, for example.

In addition, it is desirable to make the memory element 3 small in size to easily switch the magnetization direction of the memory layer 17 with a small current.

Therefore, the area of the memory element 3 is desirably set to 0.01 $\mu m^2$ or less.

Furthermore, elements may be added to the memory layer 17.

When heterogeneous elements are added, there is obtained an effect such as improvement in a heat resistance or increase in a magnetoresistive effect due to the prevention of diffusion, and increase in dielectric strength voltage accompanied with planarization. As a material of this added element, B, C, N, O, F, Mg, Si, P, Ti, V, Cr, Mn, Ni, Cu, Ge, Nb, Ru, Rh, Pd, Ag, Ta, Ir, Pt, Au, Zr, Hf, W, Mo, Re, Os, or an alloy or oxide thereof may be used.

In addition, as the memory layer 17, a ferromagnetic layer with a different composition may be directly laminated. In addition, a ferromagnetic layer and a soft magnetic layer may be laminated, or a plurality of ferromagnetic layers may be laminated through the soft magnetic layer or a non-magnetic layer. In the case of laminating in this manner, it is possible to obtain an effect according to the embodiment.

In particular, in the case where the plurality of ferromagnetic layers is laminated through the non-magnetic layer, it is possible to adjust the interaction strength between the ferromagnetic layers, and therefore an effect capable of controlling a magnetization switching current not to increase is obtained. As a material of the non-magnetic layer in this case, Ru, Os, Re, Ir, Au, Ag, Cu, Al, Bi, Si, B, C, Cr, Ta, Pd, Pt, Zr, Hf, W, Mo, Nb, or an alloy thereof may be used.

It is desirable that the film thickness of each of the magnetization-fixed layer 15 and the memory layer 17 be 0.5 nm to 30 nm.

Other configuration of the memory element may be the same as the configuration of a memory element that records information by the spin torque magnetization switching in the related art.

The magnetization-fixed layer 15 may be configured in such a manner that the magnetization direction is fixed by only a ferromagnetic layer or by using an antiferromagnetic coupling of an antiferromagnetic layer and a ferromagnetic layer.

In addition, the magnetization-fixed layer 15 may be configured by a single layer of a ferromagnetic layer, or may have a laminated ferri-pinned structure in which a plurality of ferromagnetic layers are laminated through a non-magnetic layer.

As a material of the ferromagnetic layer making up the magnetization-fixed layer 15 having the laminated ferri-pinned structure, Co, CoFe, CoFeB, or the like may be used. In addition, as a material of the non-magnetic layer, Ru, Re, Ir, Os, or the like may be used.

As a material of the antiferromagnetic layer, a magnetic material such as an FeMn alloy, a PtMn alloy, a PtCrMn alloy, an NiMn alloy, an IrMn alloy, NiO, and $Fe_2O_3$ may be exemplified.

In addition, a magnetic characteristic may be adjusted by adding a non-magnetic element such as Ag, Cu, Au, Al, Si, Bi, Ta, B, C, O, N, Pd, Pt, Zr, Hf, Ir, W, Mo, and Nb to the above-described magnetic materials, or in addition to this, a crystalline structure or various physical properties such a crystalline property, and a stability of a substance may be adjusted.

In addition, in relation to a film configuration of the memory element 3, there is no problem if the memory layer 17 may be disposed at the lower side of the magnetization-fixed layer 15. In other words, the positions of the memory layer 17 and the magnetization-fixed layer 15 are switched different from FIG. 3.

In this case, the negative thermal expansion material layer is disposed at the underlying layer 14, instead of the cap layer 18. At the interface between the underlying layer 14 and the memory layer 17, the oxide layer is formed.

<3. Specific Configuration of Embodiment>

Subsequently, a specific configuration of this embodiment will be described.

The memory apparatus includes the memory element 3, which can hold information depending on a magnetization state, disposed in the vicinity of an intersection of two kinds of address interconnections 1 and 6 (for example, a word line and a bit line) that are perpendicular to each other, as shown in FIGS. 1 and 2.

When a current in the vertical direction is applied to the memory element 3 through the two types of address interconnections 1 and 6, the magnetization direction of the memory layer 17 can be switched by the spin torque magnetization switching.

FIG. 3 shows an embodiment of the layered structure of the memory element 3 (ST-MRAM) according to the embodiment.

In the memory element 3 having the structure, the underlying layer 14, the magnetization-fixed layer 15, the intermediate layer 16, the memory layer 17 and the cap layer 18 are laminated in the stated order from the bottom.

In this case, the magnetization-fixed layer 15 is disposed under the memory layer 17 in which the direction of the magnetization M17 is switched by the spin injection.

In regard to the spin injection memory, "0" and "1" of information are defined by a relative angle between the magnetization M17 of the memory layer 17 and the magnetization M15 of the magnetization-fixed layer 15.

The intermediate layer 16 that serves as a tunnel barrier layer (tunnel insulating layer) is provided between the memory layer 17 and the magnetization-fixed layer 15, and an MTJ element is configured by the memory layer 17 and the magnetization-fixed layer 15.

The memory layer 17 is composed of a ferromagnetic material having a magnetic moment in which the direction of the magnetization M17 is freely changed in a direction perpendicular to a film face. The magnetization-fixed layer 15 is composed of a ferromagnetic material having a magnetic moment in which the direction of the magnetization M15 is freely changed in a direction perpendicular to a film face.

Information is stored by the magnetization direction of the memory layer 17 having uniaxial anisotropy. Writing is made by applying a current in the direction perpendicular to the film face, and inducing the spin torque magnetization switching. Thus, the magnetization-fixed layer 15 is disposed under the memory layer 17 in which the magnetization direction is switched by the spin injection, and is to serve as the base of the stored information (magnetization direction) of the memory layer 17.

In the embodiment, the memory layer 17 and the magnetization-fixed layer 15 are made of the perpendicular magnetization film based on Co—Fe—B having the positive magnetostriction constant.

The memory layer 17 may include the non-magnetic layer in addition to the Co—Fe—B magnetic layer. An example of the non-magnetic layer is the Ta layer. The non-magnetic layer may be formed of any one of V, Nb, Cr, W, Mo, Ti, Zr and Hf.

Since the magnetization-fixed layer 15 is the base of the information, the magnetization direction has not to be changed by recording or reading-out. However, the magnetization-fixed layer 15 does not necessarily need to be fixed to the specific direction, and only needs to be difficult to move by increasing the coercive force, the film thickness or the magnetic damping constant as compared with the memory layer 17.

The intermediate layer 16 is formed of a magnesium oxide (MgO) layer, for example. In this case, it is possible to make a magnetoresistance change ratio (MR ratio) high.

When the MR ratio is thus made to be high, the spin injection efficiency is improved, and therefore it is possible to decrease the current density necessary for switching the direction of the magnetization M17 of the memory layer 17.

The intermediate layer 16 may be configured by using, for example, various insulating materials, dielectric materials, and semiconductors such as aluminum oxide, aluminum nitride, $SiO_2$, $Bi_2O_3$, $MgF_2$, CaF, $SrTiO_2$, $AlLaO_3$, and Al—N—O, as well as magnesium oxide.

As the underlying layer 14 and the cap layer 18, a variety of metals such as Ta, Ti, W and Ru and a conductive nitride such as TiN can be used. In the underlying layer 14 and the cap layer 18, a single layer may be used or a plurality of layers including different materials may be laminated.

According to the embodiment, the cap layer 18 includes the negative thermal expansion material. The negative thermal expansion material is, for example, a conductive material, $Mn_3(x)N$. Specific examples include $Mn_3(Zn-Sn)N$, $Mn_3(Cu-Ge)N$, $Mn_3(Cu-Sn)N$ and the like. In the case of $Mn_3(Cu-Sn)N$, the ratio of Cu:0.5 and Sn:0.5 is considered.

Also, as the negative thermal expansion material, an insulating material such as $ZrW_2O_8$, $BiNiO_3$, a silicon oxide ($Li_2O-Al_2O_8$-$nSiO_2$) and the like can be used.

The cap layer 18 becomes the different layer that is contacted with the memory layer 17 at an opposite side from the intermediate layer 16. At the interface between the cap layer 18 and the memory layer 17, the oxide layer is formed. In this case, the oxide may be MgO. As the oxide of the negative thermal expansion material, $ZrW_2O_8$, $BiNiO_3$, $Li_2O$-$Al_2O_8$-$nSiO_2$ and the like can be used.

In the configuration shown in FIG. 3, the composition of the memory layer 17 is adjusted in such a manner that the magnitude of the effective diamagnetic field that the memory layer 17 receives is smaller than the saturated magnetization amount Ms of the memory layer 17.

In other words, the effective diamagnetic field that the memory layer 17 receives is decreased smaller than the saturated magnetization amount Ms of the memory layer 17 by selecting the ferromagnetic material Co—Fe—B composition of the memory layer 17.

The memory element 3 shown in FIG. 3 can be manufactured by continuously forming from the underlying layer 14 to the cap layer 18 in a vacuum apparatus, and then by forming a pattern of the memory element 3 by a processing such as a subsequent etching or the like.

FIG. 4 show various specific examples of the configurations of the cap layer 18.

According to the embodiment, the cap layer 18 is, for example, a laminated film of the oxide and the non-magnetic metal.

Figure 4A:
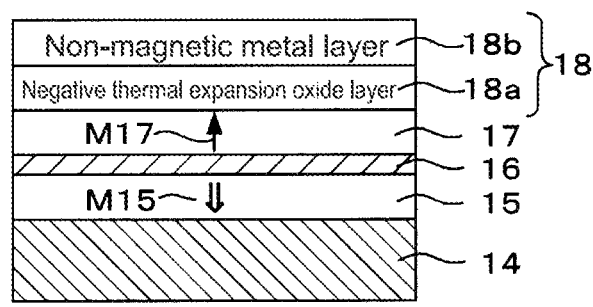
FIGS. 4A to 4C are each an explanatory view of a specific example of the memory element according to the embodiment.

FIG. 4A shows an example in which the cap layer 18 includes a negative thermal expansion oxide layer 18a and a non-magnetic metal layer 18b viewing from the memory layer 17 side.

The negative thermal expansion oxide layer 18a is a layer of, for example, $ZrW_2O_8$, $BiNiO_3$, $Li_2O$—$Al_2O_3$-$nSiO_2$ and the like.

The non-magnetic metal layer 18b is, for example, Ta, Ti, W, Ru and the like.

Figure 4B:
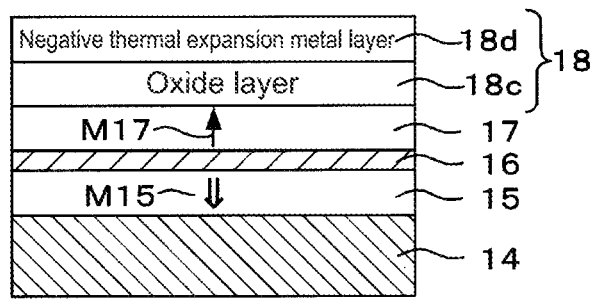

FIG. 4B shows an example that the cap layer 18 includes an oxide layer 18c and a negative thermal expansion metal layer 18d viewing from the memory layer 17 side.

The oxide layer 18c is, for example, MgO.

The negative thermal expansion metal layer 18d is, for example, $Mn_3(Zn-Sn)N$, $Mn_3(Cu-Ge)N$, $Mn_3(Cu-Sn)N$ and the like.

Figure 4C:
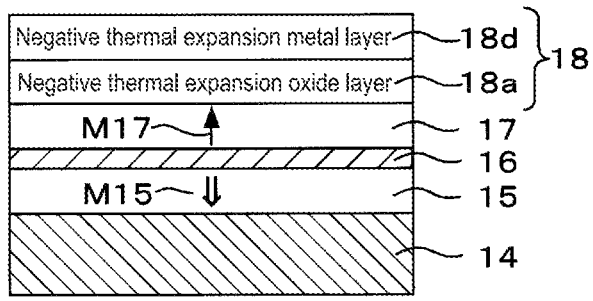

FIG. 4C shows an example in which the cap layer 18 includes the negative thermal expansion oxide layer 18a and the negative thermal expansion metal layer 18d viewing from the memory layer 17 side.

In any example in FIGS. 4A, 4B and 4C, the cap layer 18 includes the negative thermal expansion material layer (18a or 18d).

Although the memory layer 17 based on Co—Fe—B has the positive magnetostriction constant, by disposing the negative thermal expansion material to which a tensile stress is applied within the cap layer 18, the decrease in the thermal stability due to the increase in the ambient temperature can be inhibited.

In the case shown in FIG. 4C, both the oxide and the non-magnetic metal in the cap layer 18 are the negative thermal expansion material. This configuration has an advantage that the combination of two types of the negative thermal expansion materials can adjust a thermal expansion coefficient of the cap layer 18.

In each example shown in FIGS. 4A, 4B and 4C, the oxide layer (18a or 18c) is formed on at least the interface of the cap layer 18, which is contacted with the memory layer 17.

Thus, together with MgO in the intermediate layer 16, the oxide will be disposed on both sides of the memory layer 17, thereby increasing the number of the interfaces between the oxide and magnetic metal (Co—Fe—B). As a result, the perpendicular magnetic anisotropy of the memory layer 17 can be enhanced.

FIG. 5 show still other configuration examples of the cap layer 18.

Figure 5A:
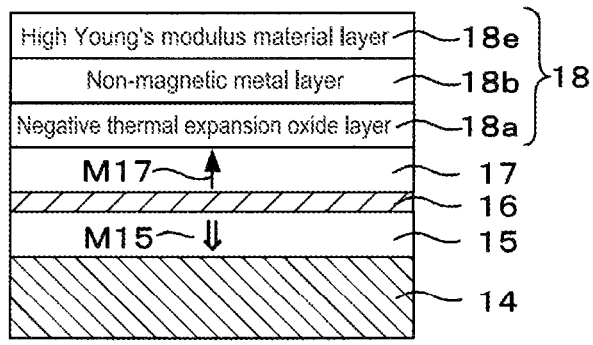
FIGS. 5A to 5C are each an explanatory view of a specific example of the memory element according to the embodiment.

FIG. 5A shows an example that the cap layer 18 includes the negative thermal expansion oxide layer 18a, the non-magnetic metal layer 18b, and a high Young's modulus material layer 18e viewing from the memory layer 17 side.

Figure 5B:
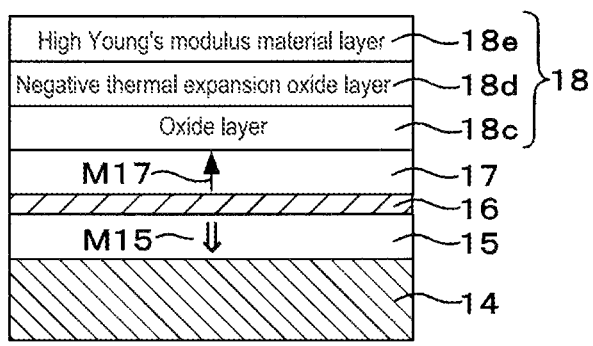

FIG. 5B shows an example that the cap layer 18 includes the oxide layer 18c, the negative thermal expansion metal layer 18d, and the high Young's modulus material layer 18e viewing from the memory layer 17 side.

Figure 5C:
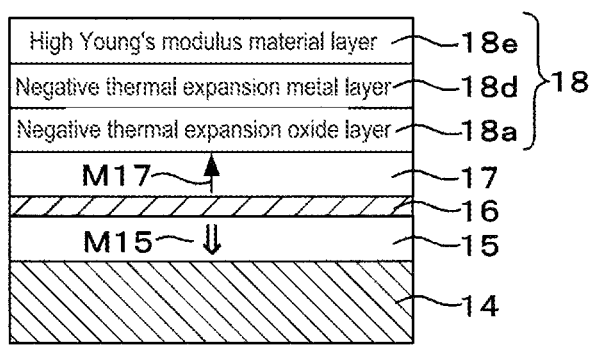

FIG. 5C shows an example that the cap layer 18 includes the negative thermal expansion oxide layer 18a, the negative thermal expansion metal layer 18d, and the high Young's modulus material layer 18e viewing from the memory layer 17 side.

In other words, the examples shown in FIGS. 5A, 5B and 5C are obtained by adding the high Young's modulus material layer 18e to the configurations shown in FIGS. 4A, 4B and 4C.

The high Young's modulus material layer 18e is a material layer having higher Young's modulus than the magnetic material in the memory layer 17.

In the examples, the magnetic layer in the memory layer 17 is Co—Fe—B, and Young's modulus of Co—Fe—B is 200 GPa.

In this case, as the high Young's modulus material layer 18e, Ir (Young's modulus: 529 GPa), Re (Young's modulus: 460 GPa), Rh (Young's modulus: 359 GPa), Ru (Young's modulus: 414 GPa), Mo (Young's modulus: 324 GPa), W (Young's modulus: 345 GPa), TiN (Young's modulus: 590 GPa), ZrN (Young's modulus: 510 GPa) and the like are cited.

By disposing the material having higher Young's modulus than the memory layer 17 on a top of the cap layer 18, it is possible to concentrate a shrink effect of the negative thermal expansion material on the memory layer 17, so that an increased stress can be effectively applied to the memory layer 17 by the negative thermal expansion material layer.

In the configurations shown in FIGS. 3 (4, 5), the memory layer 17 may have the Co—Fe—B magnetic layer and at least one non-magnetic layer such as Ta.

In this case, by adopting the configurations shown in FIGS. 4 and 5, there is formed a laminated structure where the oxide layer, the Co—Fe—B magnetic layer and the non-magnetic layer are laminated.

Figure 6:
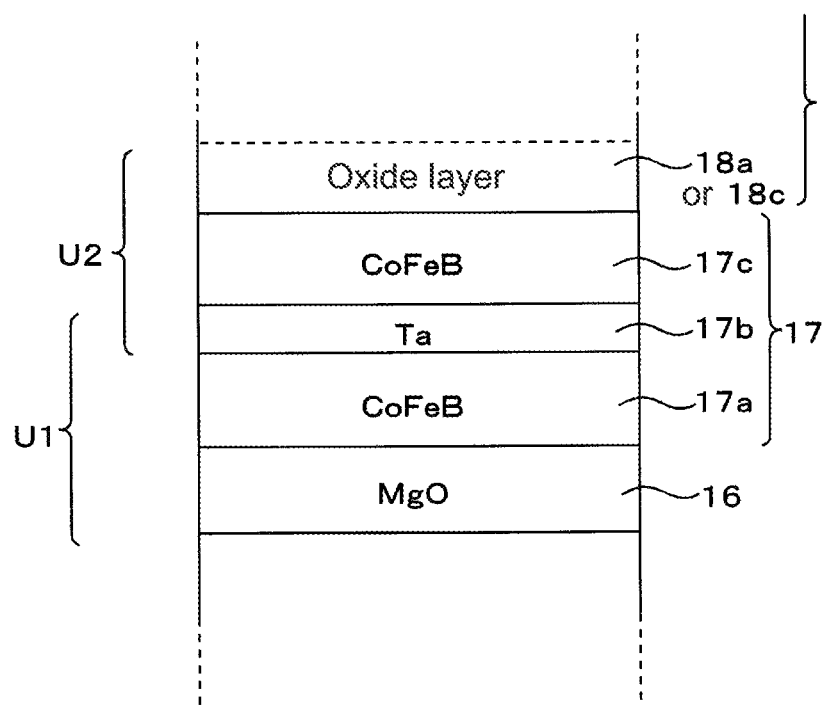
FIG. 6 is an explanatory view of a layered structure of samples according to the embodiment.

FIG. 6 will be described.

FIG. 6 shows the configuration in which the memory layer 17 is a Co—Fe—B magnetic layer 17a and a Ta non-magnetic layer 17b and a Co—Fe—B magnetic layer 17c are laminated.

The non-magnetic layer 17b may be formed of metal elements including V, Nb, Cr, W, Mo, Ti, Zr and Hf. A plurality of metal elements may be laminated.

At least on the interface of the cap layer 18, with which the memory layer 17 is contacted as described above, the oxide layer 18 (18a or 18c) is formed.

The intermediate layer 16 is the MgO layer as describe above, the interface contacted with the memory layer 17 being the oxide layer.

In other words, the oxide layer (MgO) of the intermediate layer 16, the Co—Fe—B magnetic layer 17a of the memory layer 17 and the non-magnetic layer 17b of the memory layer 17 form a laminated structure U1 of the oxide layer/the Co—Fe—B magnetic layer/the non-magnetic layer.

The interface of the cap layer 18, which is contacted with the memory layer 17 at an opposite side from the intermediate layer 16, is the oxide layer (18a or 18c). The oxide layer (18a or 18c) of the cap layer 18, the Co—Fe—B magnetic layer 17c of the memory layer 17 and the non-magnetic layer 17b of the memory layer 17 form a laminated structure U2 of the oxide layer/the Co—Fe—B magnetic layer/the non-magnetic layer.

By disposing the laminated structure U1 of the oxide layer/the magnetic material/the non-magnetic material and the laminated structure U2 of the oxide layer/the magnetic material/the non-magnetic material from the bottom, the thermal stability can be improved.

According to the above-described embodiment, since the memory layer 17 of the memory element 3 is the perpendicular magnetization film, a writing current necessary for switching the magnetization M17 direction of the memory layer 17 can be decreased.

In order to enhance the perpendicular magnetic anisotropy, it is desirable that the oxide be disposed at both sides of the memory layer 17.

In particular, the oxide is used at the interface of the memory layer 17 and the above-mentioned laminated structures U1 and U2 are formed, thereby improving the thermal stability and decreasing the writing current at the same time.

By disposing the negative thermal expansion oxide layer (18a, 18d), the decrease in the thermal stability can be inhibited even when the ambient temperature increases. Also, by disposing the high Young's modulus material layer 18e, the negative thermal expansion oxide layer (18a, 18d) can add effectively much stress to the memory layer 17. With these configurations, the thermal stability can be maintained not depending on the ambient temperature.

Thus, since the thermal stability, which is an information holding capacity, can be sufficiently secured not depending on the ambient temperature, it is possible to configure the memory element having well-balanced properties.

In this manner, operation errors can be eliminated, and operation margins of the memory element 3 can be sufficiently obtained, such that it is possible to stably operate the memory element 3.

Accordingly, it is possible to realize a memory that stably operates with high reliability.

It is also possible to decrease a writing current and to decrease power consumption when writing into the memory element 3.

As a result, it is possible to decrease power consumption of the entire memory apparatus in which a memory cell is configured by the memory element 3 of this embodiment.

Therefore, in regard to the memory including the memory element 3 capable of realizing a memory that is excellent in the information holding capacity, and stably operates with high reliability, it is possible to decrease the power consumption.

In addition, the memory apparatus that includes the memory element 3 shown in FIGS. 3 to 6 and has a configuration shown in FIG. 1 has an advantage in that a general semiconductor MOS forming process may be applied when the memory apparatus is manufactured. Therefore, it is possible to apply the memory of this embodiment as a general purpose memory.

<4. Experiment>

Here, in regard to the configuration of the memory element 3 according to this embodiment shown in FIG. 3, a sample was manufactured, and then characteristics thereof was examined.

In an actual memory apparatus, as shown in FIG. 1, a semiconductor circuit for switching or the like is present in addition to the memory element 3, but here, the examination was made on a wafer in which only the memory element is formed for the purpose of investigating the magnetization switching characteristic of the memory layer 17 adjacent to the cap layer 18.

A thermal oxide film having a thickness of 300 nm was formed on a silicon substrate having a thickness of 0.725 mm, and samples 1 to 3 of the memory element 3 having the configuration shown in FIG. 3 was formed on the thermal oxide film.

FIGS. 7A to D show materials and film thicknesses of the samples 1 to 3. The sample 1 corresponds to a comparative example, and the samples 2 and 3 correspond to the embodiments.

In all the samples 1 to 3 including the comparative example, the following structures are the common.

Underling layer 14: laminated film of a Ta film having a thickness of 10 nm and a Ru film having a film thickness of 25 nm Magnetization-fixed layer 15: laminated film of CoPt:2 nm/Ru:0.8 nm/CoFeB:2 nm Intermediate layer (tunnel insulating layer) 16: magnesium oxide film having a thickness of 0.9 nm Memory layer 17: as shown enlarged in FIG. 7D, laminated layer of CoFeB/non-magnetic layer/CoFeB having a total thickness of 2.0 nm The cap layer 18 is as follows:

As shown in FIG. 7A, the cap layer 18 of the comparative sample 1 had a laminated structure of MgO:0.8 nm/Ta:3 nm/Ru:3 nm/Ta:3 nm. Namely, no negative thermal expansion material layer is disposed.

On the other hand, in the embodiment sample 2, as shown in FIG. 7B, the cap layer 18 had a laminated structure of a MgO: 0.8 nm/Mn$_3$(CuSn)N:3 nm/Ru:3 nm/Ta:3 nm. This configuration corresponds to that shown in FIG. 4B.

In the embodiment sample 3, as shown in FIG. 7C, the cap layer 18 had a laminated structure of a MgO: 0.8 nm/Ta:3 nm/Ru:3 nm/Ta:3 nm. This configuration corresponds to that shown in FIG. 4A.

Mn$_3$(CuSn)N and ZrW$_2$O$_8$ each have a negative thermal expansion coefficient in a temperature range from 25° C. to 120° C.

In each sample, the composition of the Co—Fe—B alloy in each of magnetization-fixed layer 15 and the memory layer 17 was (Co30%—Fe70%)80%-B20% (all of which is in atm %).

The magnesium oxide (MgO) film of the intermediate layer 16 and the oxide and Mn(ZnSn)N in the cap layer 18 were formed using an RF magnetron sputtering method. Other layers were formed using a DC magnetron sputtering method.

Each sample of the memory element 3 manufactured as described above was evaluated for the spin injection magnetization switching as follows.

Before the measurement, it was configured to be able to apply a magnetic field to the memory element 3 from outside to control a switching current in such a manner that a value in a plus direction and a value in a minus direction to be symmetric to each other.

In addition, a voltage applied to the memory element 3 was set up to 1 V within a range without breaking down the intermediate layer 16.

Measurement of Switching Current Value and Thermal Stability

A pulse width (pulse width of 10 μs to 100 ms) dependency of a switching current value was measured for the purpose of evaluating the writing characteristic and the thermal stability of the memory element 3 according to this embodiment.

A value obtained by extrapolating a pulse width dependency of this current value to a pulse width 1 ns was set to the switching current value.

In addition, the inclination of a pulse width dependency of the switching current value corresponds to the above-described thermal stability index Δ=(KV/k$_B$T) of the memory element 3. The less the switching current value changed (the inclination is small) by the pulse width is, the more the memory element 3 strong against disturbance of the heat is.

Then, about twenty memory elements 3 with the same configuration were manufactured to take variation between the memory elements 3 into consideration, the above-described measurement was performed, and an average value of the switching current value and the thermal stability index (KV/k$_B$T) was determined.

The substrate was heated at arbitrary set temperature to evaluate the characteristics at each ambient temperature.

At room temperature [=25° C.], the comparative sample 1 had KV/k$_B$T of 65, the embodiment sample 2 had KV/k$_B$T of 65 and the embodiment sample 3 had KV/k$_B$T of 63.

Figure 8:
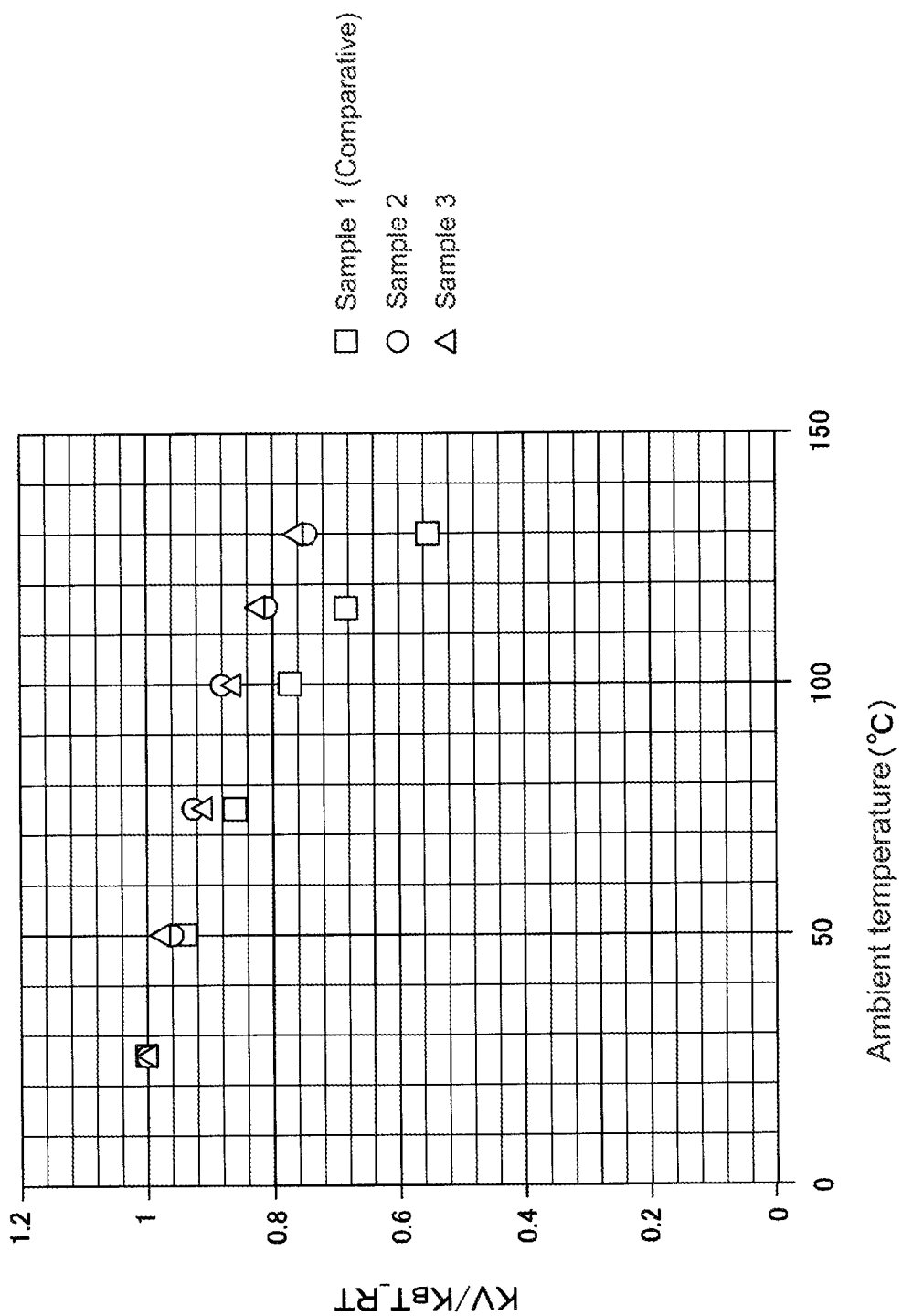
FIG. 8 is a plot of a relationship between a measured ambient temperature a thermal stability index $KV/k_BT$ of each experiment sample and a temperature.

FIG. 8 shows a relationship between the thermal stability index KV/k$_B$T in each sample and the measured ambient temperature.

As apparent from FIG. 8, there are differences among the rates of decrease in the thermal stability index KV/k$_B$T to the increase in temperature of the comparative sample 1 and the embodiment samples 2 and 3.

In general, magnetic coercive force (anisotropic magnetic field) Ms of the memory layer 17 decreases as the temperature increases. So, the thermal stability index KV/k$_B$T decreases as the temperature increases.

In each of the embodiment samples 2 and 3, as the negative thermal expansion material layer is disposed adjacent to the memory layer 17 having the positive magnetostriction constant, by applying a tensile stress along the easy axis of magnetization of the magnetic layer 17 along with the increase in the ambient temperature, the temperature dependency of KV/k$_B$T is mitigated.

Thus, in the comparative sample 1 and the embodiment samples 2 and 3, it is possible to maintain higher KV/k$_B$T at higher temperature in the embodiment samples 2 and 3.

For example, at 75° C., which is an indicator of operation guarantee at the high temperature side in a non-volatile memory, the thermal stability of the comparative sample 1 decreased by about 15% than that at room temperature. In contrast, those of the samples 2 and 3 decreased only about 7%.

Up to the ambient temperature: 120° C., as the temperature increases, the differences in KV/k$_B$T between the sample 1 and the samples 2 and 3 are widen.

In the experiment, relative high KV/k$_B$T (60 or more at room temperature) is provided in each sample including the comparative sample 1 having no negative thermal expansion material layer in the cap layer 18.

All the samples 1 to 3 including the comparative example have the laminated structures U1 and U2 as described above.

It is said that the perpendicular magnetization anisotropy arising from the interfacial magnetic anisotropy may be provided by bonding oxygen contained in the oxide with Co or Fe at the interface. Meanwhile, the non-magnetic material contacted at the interface opposite to the oxide plays a very important role.

In short, as the most basic unit, the combinations of the oxide/the magnetic material/the non-magnetic material and the non-magnetic material/the magnetic material/the oxide are important.

In the samples 1 to 3, by incorporating two important basic units (the above-mentioned laminated structures U1 and U2) into the memory layer 17, the greater KV/k$_B$T may be successfully provided.

In summary, the combinations of the oxide/the magnetic material/the non-magnetic material and the non-magnetic material/the magnetic material/the oxide are effective to improve the thermal stability and induce the magnetization switching at a low voltage. It means that the trade-off relationship between the thermal stability index Δ and the threshold value of the magnetization switching is improved. The thermal stability is improved and lower power consumption is attained as the same time.

Furthermore, by disposing the negative thermal expansion material, the decrease in the thermal stability due to the increase in the ambient temperature can be inhibited.

<5. Alternative>

While the embodiment according to the present disclosure has been described, it should be understood that the present disclosure is not limited to the layered structures of the memory element 3 shown in the above-described embodiment, but it is possible to adopt a variety of layered structures.

For example, although the composition of Co—Fe—B in the memory layer 17 and the magnetization-fixed layer 15 is the same in the embodiment, it should be understood that the present disclosure is not limited thereto, various structures may be taken without departing from the scope and spirit of the present disclosure.

Although FIGS. 4 and 5 show the layered structures having both the laminated structures U1 and U2, the layered structure having at least one of the laminated structures U1 and U2 can improve the thermal stability.

The material of the negative thermal expansion material layer is not limited to $Mn_3(Cu—Sn)N$ and $ZrW_2O_8$, and may be other materials. For example, the composition $Mn_3(x)N$ (herein x is Zn—Sn, Cu—Ge, Cu—Sn), $BiNiO_3$, silicon oxide ($Li_2O—Al_2O_3-nSiO_2$) can provide the similar beneficial effects. Still other materials of the negative thermal expansion material layer can be used.

Although the memory layer 17 used in the experiment was Co—Fe—B to which Ta was added, W, Mo, V, Nb, Ta, Cr, Ti Zr and Hf may be added singly or co-doped. In addition, other elements or oxides can be added at the same time, unless the perpendicular magnetic anisotropy is impaired. Examples of the other elements include Hf, Nb, Zr, Cr, Ti, V, Mo and W. Examples of the oxides include MgO, Al—O, $SiO_2$ and Li based oxide.

As the perpendicular magnetization material having a positive magnetostriction constant for configuring the memory layer 17, Co—Fe—B is cited. Examples of the perpendicular magnetization material include FePt, FePd, CoPt, CoPd and the like. These may be used as a base to configure the memory layer 17.

In addition, the underlying layer 14 and the cap layer 18 may have a laminated structure of a single material or a plurality of materials.

The magnetization-fixed layer 15 may be formed of a single layer, or a laminated ferri-pinned structure including two ferromagnetic layers and a non-magnetic layer. In addition, an antiferromagnetic film may be applied to the laminated ferri-pinned structure film.

The memory element 3 according to the embodiment of the present disclosure has a configuration of the magnetoresistive effect element such as a Tunneling Magneto Resistance (TMR) element. The magnetoresistive effect element as the TMR element can, be applied to a variety of electronic apparatuses, electric appliances and the like including a magnetic head, a hard disk drive equipped with the magnetic head, an integrated circuit chip, a personal computer, a portable terminal, a mobile phone and a magnetic sensor device as well as the above-described memory apparatus.

Figure 9A:
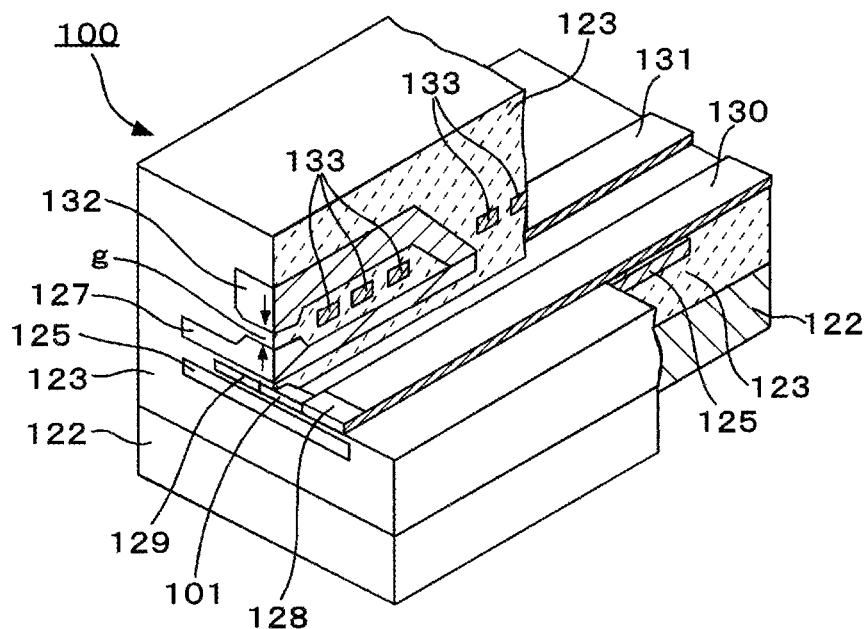
FIGS. 9A to 9B are each an explanatory view of an application of the embodiment to a magnetic head.
Figure 9B:
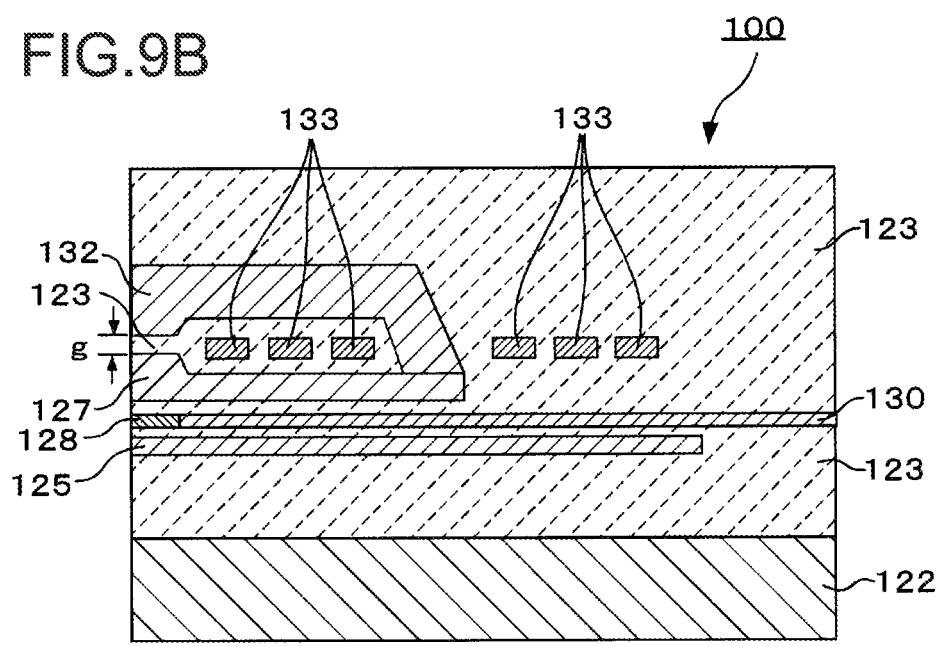

As an example, FIGS. 9A and 9B each show an application of a magnetoresistive effect element 101 having the configuration of the memory element 3 to a composite magnetic head 100. FIG. 9A is a perspective view shown by cutting some parts of the composite magnetic head 100 for discerning the internal configuration. FIG. 9B is a cross-sectional view of the composite magnetic head 100.

The composite magnetic head 100 is a magnetic head used for a hard disk apparatus or the like. On a substrate 122, the magnetoresistive effect magnetic head according to the embodiment of the present disclosure is formed. On the magnetoresistive effect magnetic head, an inductive magnetic head is laminated and thus the composite magnetic head 100 is formed. The magnetoresistive effect magnetic head functions as a reproducing head, and the inductive magnetic head functions as a recording head. In other words, the composite magnetic head 100 is configured by combining the reproducing head and the recording head.

The magnetoresistive effect magnetic head mounted on the composite magnetic head 100 is a so-called shielded MR head, and includes a first magnetic shield 125 formed on the substrate 122 via an insulating layer 123, the magnetoresistive effect element 101 formed on the first magnetic shield 125 via the insulating layer 123, and a second magnetic shield 127 formed on the magnetoresistive effect element 101 via the insulating layer 123. The insulating layer 123 includes an insulation material such as $Al_2O_3$ and $SiO_2$.

The first magnetic shield 125 is for magnetically shielding a lower side of the magnetoresistive effect element 101, and includes a soft magnetic material such as Ni—Fe. On the first magnetic shield 125, the magnetoresistive effect element 101 is formed via the insulating layer 123.

The magnetoresistive effect element 101 functions as a magnetosensitive element for detecting a magnetic signal from the magnetic recording medium in the magnetoresistive effect magnetic head. The magnetoresistive effect element 101 may have the similar film configuration to the above-described memory element 3.

The magnetoresistive effect element 101 is formed in an almost rectangular shape, and has one side that is exposed to an opposite surface of the magnetic recording medium. At both ends of the magnetoresistive effect element 101, bias layers 128 and 129 are disposed. Also, connection terminals 130 and 131 that are connected to the bias layers 128 and 129 are formed. A sense current is supplied to the magnetoresistive effect element 101 through the connection terminals 130 and 131.

Above the bias layers 128 and 129, the second magnetic shield 127 is disposed via the insulating layer 123.

The inductive magnetic head laminated and formed on the above-described magnetoresistive effect magnetic head includes a magnetic core including the second magnetic shield 127 and an upper core 132, and a thin film coil 133 wound around the magnetic core.

The upper core 132 forms a closed magnetic path together with the second magnetic shield 127, is to be the magnetic core of the inductive magnetic head, and includes a soft magnetic material such as Ni—Fe. The second magnetic shield 127 and the upper core 132 are formed such that front end portions of the second magnetic shield 127 and the upper core 132 are exposed to an opposite surface of the magnetic recording medium, and the second magnetic shield 127 and the upper core 132 are come into contact with each other at back end portions thereof. The front end portions of the second magnetic shield 127 and the upper core 132 are formed at the opposite surface of the magnetic recording medium such that the second magnetic shield 127 and the upper core 132 are spaced apart by a predetermined gap g.

In other words, in the composite magnetic head 100, the second magnetic shield 127 not only magnetically shields the upper side of the magnetoresistive effect element 101, but functions as the magnetic core of the inductive magnetic head. The second magnetic shield 127 and the upper core 132 configure the magnetic core of the inductive magnetic head. The gap g is to be a recording magnetic gap of the inductive magnetic head.

In addition, above the second magnetic shield 127, thin film coils 133 buried in the insulation layer 123 are formed. The thin film coils 133 are formed to wind around the magnetic core including the second magnetic shield 127 and the upper core 132. Bothe ends (not shown) of the thin film coils 133 are exposed to the outside, and terminals formed on the both ends of the thin film coil 133 are to be external connection terminals of the inductive magnetic head. In other words, when a magnetic signal is recorded on the magnetic recording medium, a recording current will be supplied from the external connection terminals to the thin film coil 133.

The composite magnetic head 101 as described above is equipped with the magnetoresistive effect magnetic head as the reproducing head. The magnetoresistive effect magnetic head is equipped, as the magnetosensitive element that detects a magnetic signal from the magnetic recording medium, with the magnetoresistive effect element 101 to which the technology according to the present disclosure is applied. As the magnetoresistive effect element 101 to which the technology according to the present disclosure is applied shows the excellent properties as described above, the magnetoresistive effect magnetic head can achieve to further high recording density of magnetic recording.

The present disclosure also may have the following configurations.

(1) A memory element, including:
a layered structure including
a memory layer that has magnetization perpendicular to a film face in which a magnetization direction is changed depending on information, and includes a magnetic layer having a positive magnetostriction constant, the magnetization direction being changed by applying a current in a lamination direction of the layered structure to record the information in the memory layer,
a magnetization-fixed layer having magnetization perpendicular to a film face that becomes a base of the information stored in the memory layer, and
an intermediate layer that is formed of a non-magnetic material and is provided between the memory layer and the magnetization-fixed layer; and
a negative thermal expansion material layer.

(2) The memory element according to (1) above, in which a first oxide layer is formed on a first interface between the intermediate layer that is contacted with the memory layer and the memory layer and a second oxide layer is formed on a second interface between a different layer that is contacted with the memory layer at an opposite side from the intermediate layer and the memory layer.

(3) The memory element according to (2) above, in which the second oxide layer of the different layer is the negative thermal expansion material layer.

(4) The memory element according to (2) or (3) above, in which
the negative thermal expansion material layer is disposed on a layer of the different layer other than the second interface.

(5) The memory element according to any one of (1) to (4) above, further including
a high Young's modulus material layer having a higher Young's modulus than the magnetic layer in the memory layer.

(6) The memory element according to any one of (1) to (5) above, in which
the negative thermal expansion material layer is formed to contain a conductive material $Mn_3(x)N$.

(7) The memory element according to (6) above, in which x is one of Zn—Sn, Cu—Ge and Cu—Sn.

(8) The memory element according to any one of (1) to (7) above, in which
the negative thermal expansion material layer is formed to contain at least one of $ZrW_2O_8$, $BiNiO_3$, $Li_2O$—$Al_2O_3$-$nSiO_2$.

(9) The memory element according to any one of (1) to (8) above, in which
the magnetic layer having the positive magnetostriction constant is a Co—Fe—B magnetic layer.

(10) The memory element according to any one of (1) to (9) above, in which
the memory layer includes a Co—Fe—B magnetic layer and at least one non-magnetic material layer, and
a laminated structure in which an oxide layer, the Co—Fe—B magnetic layer and the non-magnetic layer of the memory layer are laminated is formed.

(11) The memory element according to (10) above, in which
the laminated structure is formed of an oxide layer of the intermediate layer, the Co—Fe—B magnetic layer of the memory layer and the non-magnetic layer of the memory layer.

(12) The memory element according to (10) or (11) above, in which
the laminated structure is formed of an oxide layer of a different layer, the Co—Fe—B magnetic layer of the memory layer and the non-magnetic layer of the memory layer.

It should be understood by those skilled in the art that various modifications, combinations, sub-combinations and alterations may occur depending on design requirements and other factors insofar as they are within the scope of the appended claims or the equivalents thereof.

What is claimed is:

1. A memory element, comprising:
a layered structure including:
a memory layer that has magnetization perpendicular to a film face in which a magnetization direction is changed depending on information, and includes a magnetic layer having a positive magnetostriction constant, the magnetization direction being changed by applying a current in a lamination direction of the layered structure to record the information in the memory layer,
a magnetization-fixed layer having magnetization perpendicular to the film face that becomes a base of the information stored in the memory layer;
an intermediate layer that is formed of a non-magnetic material and is provided between the memory layer and the magnetization-fixed layer; and
a negative thermal expansion material layer.

2. The memory element according to claim 1, wherein
a first oxide layer is formed on a first interface between the intermediate layer that is contacted with the memory layer and the memory layer and a second oxide layer is formed on a second interface between a different layer that is contacted with the memory layer at an opposite side from the intermediate layer and the memory layer.

3. The memory element according to claim 2, wherein
the second oxide layer of the different layer is the negative thermal expansion material layer.

4. The memory element according to claim 2, wherein
the negative thermal expansion material layer is disposed on a layer of the different layer other than the second interface.

5. The memory element according to claim 1, further comprising
 a high Young's modulus material layer having a higher Young's modulus than the magnetic layer in the memory layer.

6. The memory element according to claim 1, wherein
 the negative thermal expansion material layer is formed to contain a conductive material $Mn_3(x)N$.

7. The memory element according to claim 6, wherein
 x is one of Zn—Sn, Cu—Ge and Cu—Sn.

8. The memory element according to claim 1, wherein
 the negative thermal expansion material layer is formed to contain at least one of $ZrW_2O_8$, $BiNiO_3$ and/or $Li_2O$—$Al_2O_3$-$nSiO_2$.

9. The memory element according to claim 1, wherein
 the magnetic layer having the positive magnetostriction constant is a Co—Fe—B magnetic layer.

10. The memory element according to claim 1, wherein
 the memory layer includes a Co—Fe—B magnetic layer and at least one non-magnetic material layer, and
 a laminated structure in which an oxide layer, the Co—Fe—B magnetic layer and the non-magnetic layer of the memory layer are laminated is formed.

11. The memory element according to claim 10, wherein
 the laminated structure is formed of an oxide layer of the intermediate layer, the Co—Fe—B magnetic layer of the memory layer and the non-magnetic layer of the memory layer.

12. The memory element according to claim 10, wherein
 the laminated structure is formed of an oxide layer of a different layer, the Co—Fe—B magnetic layer of the memory layer and the non-magnetic layer of the memory layer.

13. A memory apparatus, comprising:
 a memory element having a layered structure including:
  a memory layer that has magnetization perpendicular to a film face in which a magnetization direction is changed depending on information, and includes a magnetic layer having a positive magnetostriction constant, the magnetization direction being changed by applying a current in a lamination direction of the layered structure to record the information in the memory layer;
  a magnetization-fixed layer having magnetization perpendicular to the film face that becomes a base of the information stored in the memory layer;
  an intermediate layer that is formed of a non-magnetic material and is provided between the memory layer and the magnetization-fixed layer;
 two types of interconnections intersecting each other, sandwiching the memory element, and through which a current flows in a lamination direction to the memory element; and
 a negative thermal expansion material layer.

\* \* \* \* \*